United States Patent [19]
Stolmeijer

[11] Patent Number: 5,834,159
[45] Date of Patent: Nov. 10, 1998

[54] IMAGE REVERSAL TECHNIQUE FOR FORMING SMALL STRUCTURES IN INTEGRATED CIRCUITS

[75] Inventor: André Stolmeijer, Santa Clara, Calif.

[73] Assignee: Advanced Micro Devices, Inc., Sunnyvale, Calif.

[21] Appl. No.: 635,988

[22] Filed: Apr. 22, 1996

[51] Int. Cl.[6] .................................................. G03F 7/00
[52] U.S. Cl. ...................... 430/312; 430/313; 430/314; 430/316
[58] Field of Search .................................. 430/311, 312, 430/313, 314, 316, 317, 323, 324, 329

[56] References Cited

U.S. PATENT DOCUMENTS

| | | | |
|---|---|---|---|
| 5,238,810 | 8/1993 | Lowrey et al. | 430/313 |
| 5,270,236 | 12/1993 | Rösner | 437/48 |
| 5,283,208 | 2/1994 | Lorsung et al. | 437/228 |

FOREIGN PATENT DOCUMENTS 0384145A  8/1990  European Pat. Off. .

Primary Examiner—Kathleen Duda
Attorney, Agent, or Firm—Sawyer & Associates

[57] ABSTRACT

The present invention provides a method for fabricating small structures to be employed in integrated circuits formed on a semiconductor substrate. Examples of such small structures include contacts, vias, and metal lines. The method of the present invention employs an image reversal technique to obtain improved feature definition. In forming a feature in a layer of material, a clear field reticle is used to form patterned segments of photoresist each having a size, a shape, and a location substantially identical to the size, the shape, and the location of one of the features intended to be formed in the layer of material. This method is employed instead of using a dark field reticle which forms windows in a photoresist each having a size, a shape, and a location substantially identical to the size, the shape, and the location of one of the features intended to be formed in the layer of material. For small structures, the openings or windows in a photoresist are harder to form than the patterned segments of photoresist. With the method of the present invention which employs a clear field reticle to form a mask comprising patterned segments of photoresist, the limitations of patterning small windows in a photoresist with the use of a dark field reticle are avoided. The accuracy of forming the small structures is thus improved.

18 Claims, 3 Drawing Sheets

IMAGE REVERSAL TECHNIQUE FOR FORMING SMALL STRUCTURES IN INTEGRATED CIRCUITS

TECHNICAL FIELD

The present invention relates generally to fabricating small structures ($\leq 0.5$ μm in size) such as contacts, vias, and metal lines to be employed in integrated circuits formed on a semiconductor substrate, and, more particularly, to a method which enables a clear field reticle to be used in the formation of such small structures.

BACKGROUND ART

The present integrated circuit devices are formed on a silicon substrate and comprise doped regions in the substrate to which source or drain connections are made, separated by a gate control region. Electrical connections to the source, gate, and drain electrodes are made by interconnects, e.g., metal interconnects, which are supported over the substrate by an interlayer dielectric.

Conventional integrated circuits employ multiple levels of interconnects. For example, a first level patterned interconnect contacts the source and drain contacts and the gate electrode in a desired pattern. The formation of the first level patterned interconnect is conventionally followed by deposition of an oxide over the semiconductor substrate. This oxide forms the interlayer dielectric. The oxide is sequentially patterned and etched to form contact/via openings therein. These contact/via openings in the interlayer dielectric are filled with metal plugs using blanket metal deposition followed by etchback or polishing. A layer of patterned metal lines comprising the second level patterned interconnect is formed on the interlayer dielectric. The metal plugs form electrical contact between the first level patterned interconnect and the second level patterned interconnect. Additional levels of patterned metal lines or interconnects may be formed as well; each level of interconnects is also separated by an interlayer dielectric layer. Electrical connection between the different levels of interconnects is provided by additional metal plugs.

To etch contact/via openings into the interlayer dielectric, a photoresist is formed thereon. The photoresist is exposed to light and developed out, leaving designated regions of the oxide exposed, i.e., having no photoresist formed thereon. The exposed regions of the oxide are etched to create contact/via openings therein.

In general terms, an opening or small window is formed in the photoresist which exposes the underlying layer of material (e.g., oxide) to subsequent treatment. (e.g., etching). Such a small window in the photoresist, which exposes the underlying layer of material, is formed by exposing the photoresist to light and developing out the photoresist.

In principle, the photoresist may comprise either positive photoresist or negative photoresist. However, for patterning small structures, i.e., $\leq 0.5$ μm in size, positive photoresist is conventionally employed.

For a positive photoresist, the portion of the photoresist exposed to light is developed out. The portion of the photoresist which is not exposed remains intact, thereby providing a mask comprising patterned photoresist which protects the underlying material formed directly beneath during subsequent processing.

In contrast, for a negative photoresist, the portion of the photoresist which is not exposed to light is developed out. The portion of the photoresist which is exposed remains intact, thereby providing a mask comprising patterned photoresist which protects the underlying material formed directly beneath during subsequent processing.

Negative photoresist for use in defining small structures, i.e., $\leq 0.5$ μm in size, however, is not available. The minimum feature size which can be patterned using currently available negative photoresist is not smaller than 1.0 μm. In contrast, currently available positive photoresist can be used to pattern structures as small as 0.25 to 0.35 μm in size. Consequently, for patterning small structures, positive photoresist is conventionally employed. Accordingly, the term "photoresist" will hereinafter be equated with "positive photoresist" unless specified otherwise.

To expose the photoresist, ultra-violet light is passed through a reticle mask having the desired pattern formed thereon. The pattern in the reticle mask comprises opaque and transparent areas, i.e., dark areas and clear areas. Photoresist beneath the clear areas of the reticle are exposed to the UV light, while the photoresist under the dark areas of the reticle mask remain unexposed.

Accordingly, a single window is formed in a photoresist, i.e., a positive photoresist, by transmitting UV light through a clear area in the reticle mask which otherwise comprises dark areas. The clear area is surrounded by the dark areas. Consequently, this reticle mask is conventionally referred to as a dark field reticle.

The photoresist directly beneath the clear areas of the dark field reticle is exposed and developed out. Accordingly, the layer of material lying under the photoresist can be exposed to subsequent treatment to form features such as openings therein. For example, to etch a contact opening in an oxide formed beneath a positive photoresist, a dark field reticle is employed to develop out an opening or window in the photoresist which allows subsequent etching of the oxide. The photoresist having the window formed therein serves as a mask. The window in the photoresist has a size, a shape, and a location substantially identical to the size, the shape, and the location of the contact opening intended to be formed in the oxide.

In contrast, a photoresist can be patterned such that a patterned segment of the photoresist (instead of a window in the photoresist), has a size, a shape, and a location substantially identical to the size, the shape, and the location of the feature intended to be formed in the underlying layer of material. The patterned segment of photoresist is formed to protect the underlying layer of material, (e.g., oxide) from subsequent treatment, (e.g., etching). The patterned segment of photoresist is delineated by a dark area in the reticle mask which otherwise comprise clear areas. This dark area in the reticle mask is surrounded by the clear areas in the reticle mask. As such, this reticle mask is conventionally referred to as a clear field reticle.

Photoresist, i.e., positive photoresist, directly beneath the dark areas of the reticle mask is not exposed to ultra-violet light and thus not developed out. Accordingly, the layer of material lying under the photoresist is protected during subsequent treatment, enabling a feature to be formed in the underlying material. For example, to form a feature in a layer of polysilicon formed beneath a positive photoresist, a clear field reticle is employed. The dark areas in the clear field reticle (i.e., the reticle mask) prevent the photoresist directly beneath from being developed out, thereby forming a patterned segment of photoresist which protects the layer of material lying under the photoresist from subsequent treatment.

As device geometry becomes smaller, the fabrication of windows in the photoresist becomes increasingly difficult due to the physical limitations of the small clear areas in the dark field reticle which are used to form the windows. For small windows, the width of the clear areas in the dark field reticle is accordingly small. Consequently, an insufficient amount of light is passed through these small clear areas in the reticle mask. Fidelity between the pattern in the dark field reticle and the resultant pattern formed in the photoresist is thus degraded. For example, a dark field reticle intended to create square contact/via openings may instead produce rounded contact/via openings.

The prior art solution to the problem of having an insufficient amount of light transmitted through the dark field reticle is to over-expose the photoresist. To over-expose the photoresist, either the intensity of the UV source is increased or the photoresist is exposed for a longer period of time. Conventionally, to over-expose the photoresist, the photoresist is exposed for a longer period of time.

Over-exposing the photoresist is an acceptable solution when employing a dark field reticle to pattern contact/via openings wherein each of the contact/via openings is the same size. However, this solution is inadequate if both small windows and large windows are to be formed on the same photoresist mask; e.g., if a single photoresist mask is intended to pattern both contact/via openings which are small, i.e., <0.5 μm, as well as to form metal lines which can be any length, width, and shape. (As used herein, the term "metal lines" refers to conductive lines used for electrically connecting devices on the same level.) The clear areas in the dark field reticle which delineate the contact/via openings that are small will limit light throughput. In contrast, the clear areas in the dark field reticle which delineate the metal lines, which are larger, will not adversely restrict throughput. Consequently, over-exposing the photoresist will cause too much light to be passed through the larger clear areas in the dark field reticle resulting in pattern distortion. Fidelity between the pattern in the dark field reticle and the resultant pattern formed in the photoresist is degraded. The windows in the photoresist will be enlarged while the remaining photoresist will be smaller than intended. Rounding of the edges or corners of the photoresist may also occur.

The throughput of UV light is less of a problem when small structures are delineated by a clear field reticle used to produced patterned segments of photoresist having a size, a shape, and a location substantially identical to the size, the shape, and the location of the features intended to be formed in the underlying layer of material. With a mask comprising such patterned segments of photoresist, the small structures are delineated by small dark areas in the clear field reticle as opposed to small clear areas in the dark field reticle. To form the mask comprising such patterned segments of photoresist, the UV light is transmitted through the wide clear regions that surround the small dark areas in the clear field reticle. Accordingly, sufficient light levels are achieved to properly expose the photoresist without relying on over-exposure techniques. It can be concluded that windows in a photoresist, i.e., a positive photoresist, are more difficult to fabricate than patterned segments of photoresist when the size of the windows or patterned segments of photoresist is small ($\leq 0.5$ μm). Consequently, the formation of contact/via openings and metal lines is better achieved with a mask comprising patterned segments of photoresist than with a mask comprising windows formed in a photoresist.

(In principle, a negative photoresist can be used to form contact/via openings and metal lines with a clear field reticle. However, as described above, negative photoresist for use in defining small structures, i.e., $\leq 0.5$ μm in size, is not available.)

A method for forming small structures such as contact/via openings and metal lines which employs patterned segments of positive photoresist having a size, a shape, and a location substantially identical to the size, the shape, and the location of the contact/via openings and metal lines has been disclosed in prior art. For example, U.S. Pat. No. 5,283,208 issued Feb. 1, 1994, discloses one method whereby an insulating layer is formed around a mandrel or sacrificial stud, i.e., a block of material with substantially vertical sidewalls. The size and position of the mandrel are delineated by patterned segments of photoresist. The mandrel is removed, thereby leaving a cavity in the insulating layer. The cavity is filled with material to form the desired structure. This cavity in the insulating layer may be filled with a metal plug or a metal line. As such, the mandrel defines the size and position of the metal plug or metal line which, as stated above, is delineated by the patterned segments of photoresist. Accordingly, the metal plug or metal line is delineated by a clear field reticle. This method, however, is complicated by the requirement for a layer of sacrificial material to form the mandrel.

Thus, there remains a need for an alternative method for forming contact/via openings and metal lines using a clear field reticle which avoids most, if not all, the foregoing problems.

DISCLOSURE OF INVENTION

In accordance with the invention, a method is provided for using a clear field reticle to form a mask comprising patterned segments of photoresist formed from a first layer of photoresist to pattern openings each having a size, a shape, and a location in a layer of material formed over a semiconductor substrate. The method comprise the steps of:

(a) forming the first layer of photoresist on the layer of material formed over the semiconductor substrate;

(b) exposing the first layer of photoresist by transmitting light through a clear field reticle having clear areas which allow light to be directed onto portions of the first layer of photoresist to become exposed regions and having dark areas which prevent light from exposing portions of the first layer of photoresist to remain unexposed regions, the unexposed regions having a size, a shape, and a location substantially identical to the size, the shape, and the location of the openings intended to be formed in the layer of material;

(c) developing the first layer of photoresist, thereby removing the exposed regions of the first layer of photoresist, the unexposed regions remaining intact, the unexposed regions forming the patterned segments of photoresist, each patterned segment of photoresist having a size, a shape, and a location substantially identical to the size, the shape, and the location of the openings intended to be formed in the layer of material;

(d) etching the layer of material, thereby forming a step therein directly beneath each of the patterned segments of photoresist which serve as a mask during etching, each step having a size, a shape, and a location substantially identical to the size, the shape, and the location of one of the openings intended to be formed in the layer of material;

(e) removing the first layer of photoresist;

(f) depositing a layer of planarizable material over the layer of material;

(g) removing a portion of the layer of planarizable material, thereby exposing each step in the layer of material; and (h) etching the layer of material, thereby forming the openings therein, the layer of planarizable material serving as a mask during etching.

The layer of planarizable material can be removed after etching the layer of material to form each of the openings therein. The openings can be filled with a metal to form contacts, vias, or metal lines. In the case where the openings are filled with metal, the layer of material is a dielectric such as oxide, nitride, or polyimide.

The present invention provides a method for fabricating small structures to be employed in integrated circuits formed on a semiconductor substrate. (By small structures is meant structures ≦0.5 μm in size, such as contacts, vias, and metal lines.)

The method of the present invention improves the definition of features, e.g., contacts or vias, patterned in the layer of material.

As described above, for small structures, openings or windows in a photoresist are harder to form than patterned segments of photoresist. In the method of the present invention, a clear field reticle is used to form patterned segments of photoresist each having a size, a shape, and a location substantially identical to the size, the shape, and the location of one of the features intended to be formed in the layer of material. This method is employed instead of using a dark field reticle which forms windows in a photoresist each having a size, a shape, and a location substantially identical to the size, the shape, and the location of one of the features intended to be formed in the layer of material. Consequently, the limitations of patterning small windows in a photoresist are avoided. The method of the present invention thus improves the accuracy in forming such small structures.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 1–8 are cross-sectional views at various stages in the processing of a semiconductor substrate in accordance with the present invention, in which:

FIG. 1 depicts a conventional semiconductor structure prior to performing the first masking and etching;

FIG. 2 depicts the structure after exposing and developing the first layer of photoresist;

FIG. 3 depicts the step in the layer of oxide formed by etching the oxide;

FIG. 4 depicts the structure after removing the first layer of photoresist;

FIG. 5 depicts the second layer of photoresist formed on the layer of oxide;

FIG. 6 depicts the second layer of photoresist after etching to expose the step;

FIG. 7 depicts the opening formed in the layer of oxide by etching the oxide; and FIG. 8 depicts the structure after removing the second layer of photoresist and filling the opening with metal.

BEST MODES FOR CARRYING OUT THE INVENTION

Figure 1:
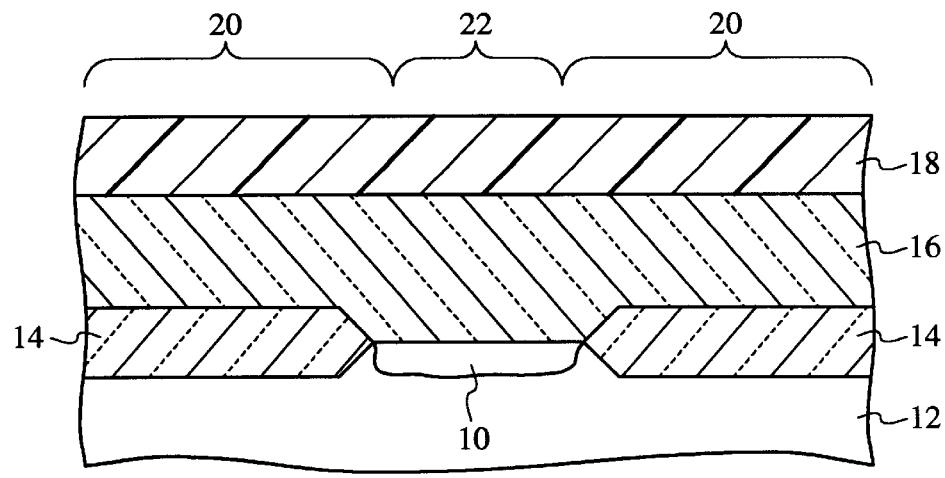

Reference is now made in detail to a specific embodiment of the present invention, which illustrates the best mode presently contemplated by the inventor for practicing the invention. Alternative embodiments are also briefly described as applicable.

The present invention provides a method for fabricating small structures (structures ≦0.5 μm in size, such as contacts, vias, and metal lines) to be employed in integrated circuits formed on a semiconductor substrate. As is conventional for defining small structures, positive photoresist (hereinafter referred to as photoresist) is used.

The method of the present invention employs an image reversal technique to obtain improved feature definition. To form features in a layer of material, a clear field reticle is used to form patterned segments of photoresist, each having a size, a shape, and a location substantially identical to the size, the shape, and the location of one of the features intended to be formed in the layer of material. This method is employed instead of using a dark field reticle which forms windows in a photoresist, each having a size, a shape, and a location substantially identical to the size, the shape, and the location of one of the features intended to be formed in the layer of material. The clear field reticle produces an image or pattern on the surface of the substrate that is the negative (i.e., reverse) of the image produced by a dark field reticle. By image reversal is meant that a clear field reticle is used instead of a dark field reticle to form a pattern with the reverse image.

With a mask comprising patterned segments of photoresist each having a size, a shape, and a location substantially identical to the size, the shape, and the location of one of the features intended to be formed, small structures such as small contact/via openings are delineated by small opaque or dark areas in a clear field reticle as opposed to small transparent or clear areas in the dark field reticle. To form the patterned segments of photoresist, UV light is transmitted through the wide transparent regions that surround the small dark areas in the clear field reticle. Accordingly, sufficient light levels are achieved to properly expose the photoresist without relying on over-exposure techniques.

In particular, the method of the present invention employs a clear field reticle to form a mask comprising patterned segments of photoresist formed from a first layer of photoresist to pattern openings in a layer of material formed over a semiconductor substrate. The patterned segments of photoresist protect the underlying layer of material, (e.g., oxide) from subsequent treatment, (e.g., etching). The patterned segments of photoresist are delineated by dark areas in the clear field reticle, which prevent portions of the photoresist from being exposed to ultra-violet light and developed out. In accordance with the present invention, each of the openings in the layer of material has a size, a shape, and a location substantially identical to one of the patterned segments of photoresist.

The method of the present invention comprises the steps of:

(a) forming the first layer of photoresist on the layer of material formed over the semiconductor substrate;

(b) exposing the first layer of photoresist by transmitting light through a clear field reticle having clear areas which allow light to be directed onto to portions of the first layer of photoresist to become exposed regions and having dark areas which prevent light from exposing portions of the first layer of photoresist to remain unexposed regions, the unexposed regions having a size, a shape, and a location substantially identical to the size, the shape, and the location of the openings intended to be formed in the layer of material;

(c) developing the first layer of photoresist, thereby removing the exposed regions of the first layer of photoresist, the unexposed regions remaining intact, the unexposed regions forming the patterned segments of photoresist, each patterned segment of photoresist having a size, a shape, and a location substantially identical to the size, the shape, and the location of the openings intended to be formed in the layer of material;

(d) etching the layer of material, thereby forming a step therein directly beneath each of the patterned segments of photoresist which serve as a mask during etching, each step having a size, a shape, and a location substantially identical to the size, the shape, and the location of one of the features intended to be formed in the layer of material;

(e) removing the first layer of photoresist;

(f) depositing a layer of planarizable material, e.g., a second layer of photoresist, over the layer of material;

(g) removing a portion of the layer of planarizable material, thereby exposing each step in the layer of material; and (h) etching the layer of material, thereby forming the openings therein, the layer of planarizable material serving as a mask during etching.

For small structures, windows in a photoresist are harder to form than patterned segments of photoresist. Consequently, the formation of contact/via openings and metal lines is better achieved with a mask comprising patterned segments of photoresist each having a size, a shape, and a location substantially identical to the size, the shape, and the location of the contact/via openings and metal lines intended to be formed than with a mask comprising windows in a photoresist each having a size, a shape, and a location substantially identical to the size, the shape, and the location of the contact/via openings and metal lines intended to be formed. With the use of a clear field reticle to form a mask comprising patterned segments of photoresist, the limitations of patterning small windows in a photoresist with the use of a dark field reticle are avoided. Accordingly, the method of the present invention, which employs a clear field reticle to form a mask comprising patterned segments of photoresist, improves the accuracy of forming such small structures.

In the fabrication of semiconductor integrated circuits, doped regions 10 are formed in a major surface of a semiconductor substrate 12, as shown in FIG. 1, or in an epitaxial layer (not shown) formed thereon. Oxide regions such as field oxide 14 may be formed to isolate one device from another.

Once the devices have been defined by the various steps of masking, etching, doping, oxide formation, etc., it is necessary to form interconnects, e.g., metal interconnects, to electrically connect the devices with each other and provide a conductive path to external circuitry.

As is conventional, the interconnect formation is preceded by formation of a layer of dielectric, or patternable material, 16 which covers the field oxide 14 and all underlying conductive regions in order to prevent shorts to the interconnects. These underlying conductive regions may include polysilicon, which may be employed, for example, in the formation of gate control regions, and doped regions 10 in the semiconductor substrate, such as source/drain regions. The layer of dielectric 16 is referred to as the first interlayer dielectric. This layer of dielectric 16 electrically isolates the underlying conductive regions.

The method of the present invention begins with the formation of this layer of dielectric 16. The layer of dielectric 16 may comprise oxide, and consequently, is referred to herein as a layer of oxide. This layer of oxide 16 is formed by conventional processes to the typical thickness employed in this technology. Preferably, the layer of oxide 16 is planarized. Such planarization can be accomplished by etchback or polishing. Polishing may include chemical mechanical polishing.

In accordance with the present invention, a mask comprising patterned segments of photoresist is provided which delineates the desired pattern to be transferred to the layer of oxide 16. Specifically, a first layer of photoresist 18 is formed on the layer of oxide 16. The first layer of photoresist 18 is exposed and developed to form a pattern therein. In particular, UV light is transmitted through a reticle mask, i.e., a clear field reticle, having clear areas and dark areas which delineate the pattern to be formed in the first layer of photoresist 18. The clear areas are transparent while dark areas are opaque. Accordingly, the portions of the first layer of photoresist 18 below the clear areas are exposed and become exposed regions such as region 20 shown in FIG. 1. The portions of the first layer of photoresist below the dark areas are not exposed and remain unexposed regions such as region 22 shown in FIG. 1. In accordance with the present invention, the unexposed regions 22 have a size, a shape, and a location substantially identical to the size, the shape, and the location of the features intended to be formed in the layer of oxide 16. The exposed regions 20 of the photoresist layer 18 are developed out. The unexposed regions, i.e., region 22, remain intact.

The first layer of photoresist 18, once patterned, (hereinafter referred to as the patterned segments of photoresist), serves as a mask. As described above, the patterned segments of photoresist 18 protect the underlying layer of material, i.e., the layer of oxide 16, from subsequent treatment, which in this case corresponds to etching of the layer of oxide.

As described above, the patterned segments of photoresist 18 are delineated by dark areas in the clear field reticle. To form the patterned segments of photoresist 18, the UV light is transmitted through the clear areas that surround the dark areas in the clear field reticle. In the case where the structures to be patterned in the layer of oxide 16 are small, the dark areas in the clear field reticle are small in comparison to the clear area. Accordingly, sufficient light levels are achieved to properly expose the photoresist without relying on over-exposure techniques.

Figure 2:
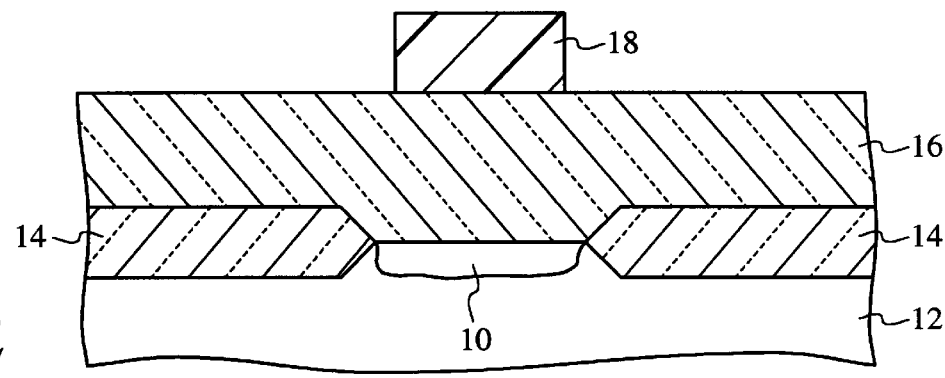

FIG. 2 depicts one such patterned segment of photoresist 18 which is thereby formed. While one such patterned segment of photoresist 18 is shown, it will be readily apparent to those skilled in this art that in fact a plurality of such patterned segments of photoresist are formed. The patterned segments of photoresist 18, such as the patterned segment of photoresist shown in FIG. 2, serve as a mask for the subsequent patterning of the layer of oxide 16. In general, the patterned segments of photoresist 18 reside above regions in the layer of oxide 16 where the interconnects or other small structures are intended to be formed. The size of a patterned segment of photoresist 18 may be less than about 0.5 $\mu$m without requiring over-exposure of the photoresist.

Figure 3:
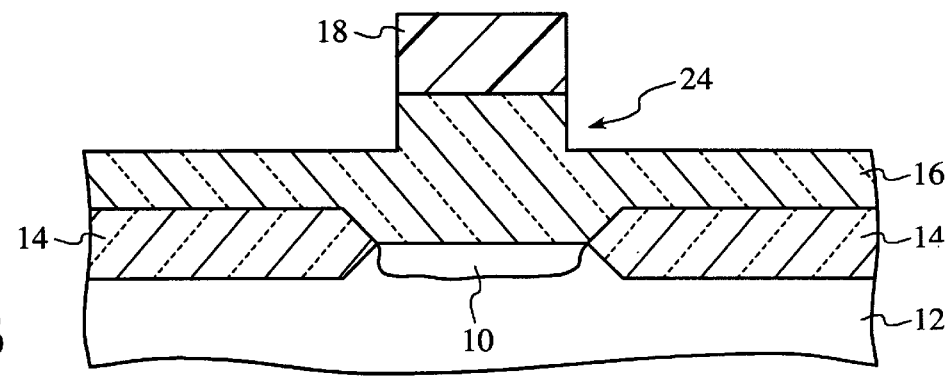

The layer of oxide 16 is etched to form steps therein such as the step 24 shown in FIG. 3. While one such step 24 is shown formed in the layer of oxide 16, it will be readily apparent to those skilled in this art that in fact a plurality of such steps are formed. The step is formed beneath the patterned segment of photoresist 18 which protects the underlying portion of the layer of oxide 16 from etching.

Consequently, the patterned segments of photoresist 18 serve as a mask during etching. In accordance with the present invention, the step 24 has a size, a shape, and a location substantially identical to the size, the shape, and the location of the feature intended to be formed in the layer of oxide 16.

Figure 4:
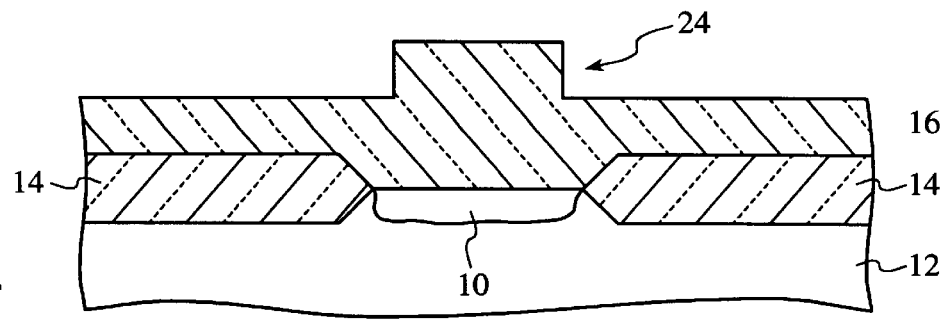

The patterned segments of photoresist 18 are then removed. FIG. 4 shows the step 24 in the layer of oxide 16 after the patterned first layer of photoresist 18 is removed.

Figure 5:
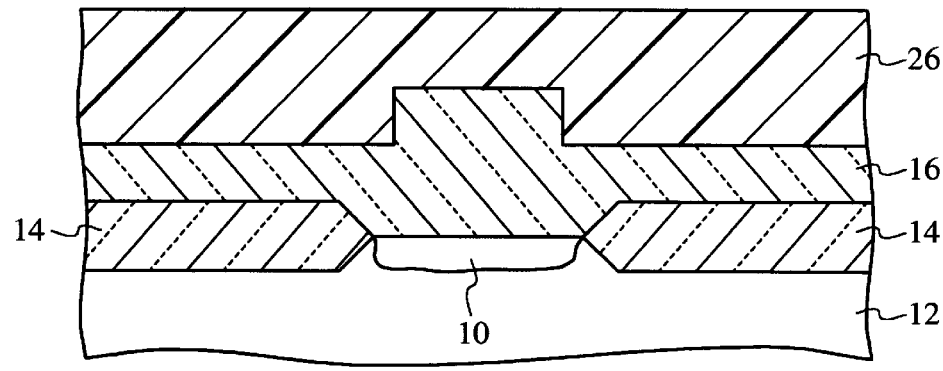

A layer of planarizable material 26 is formed over the layer of oxide 16. In one embodiment of the present invention, the layer of planarizable material 26 comprises a second layer of photoresist. The thickness of the second layer of photoresist 26, is preferably sufficient to cover the step 24 as depicted in FIG. 5. Preferably, the second layer of photoresist 26 has a surface which is substantially flat or planar as may be achieved with spin-on photoresist. Spin-on photoresist, after deposition, dries and flattens out.

The previous step, i.e., removing the patterned segments of photoresist 18 subsequent to etching the layer of oxide 16, aids in providing a planarized second layer of photoresist 26. Depositing the second layer of photoresist 26 over the step 24 having the patterned segment of photoresist 18 formed thereon prevents the second layer of photoresist from being uniformly smooth over the step.

Figure 6:
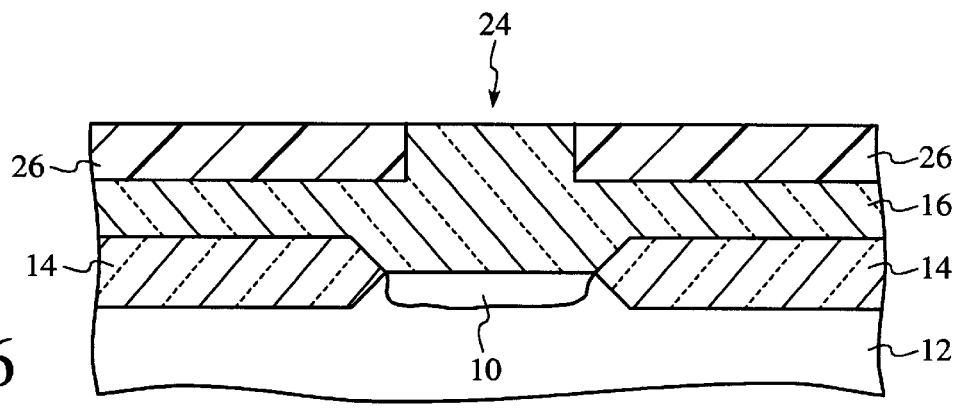

The second layer of photoresist 26 is planarized by etchback such that step 24 in the layer of oxide 16 is exposed as shown in FIG. 6.

Figure 7:
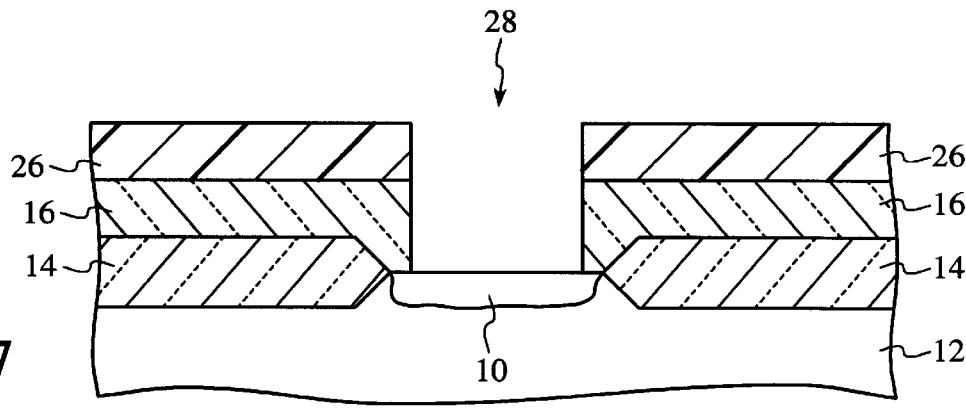

The exposed oxide is etched thereby forming an opening 28 in the layer of oxide 16 as depicted in FIG. 7. While one such opening 28 is shown formed in the layer of oxide 16, it will be readily apparent to those skilled in this art that in fact a plurality of such openings are formed. The second layer of photoresist 26 serves as an etch mask during the etching of the layer of oxide 16. Accordingly, the etching process must selectively etch the layer of oxide 16 and not the second layer of photoresist 26. In accordance with the present invention, the opening 28 has a size, a shape, and a location delineated by the patterned segment of photoresist 18 which is delineated by the dark area of the clear field reticle.

Figure 8:
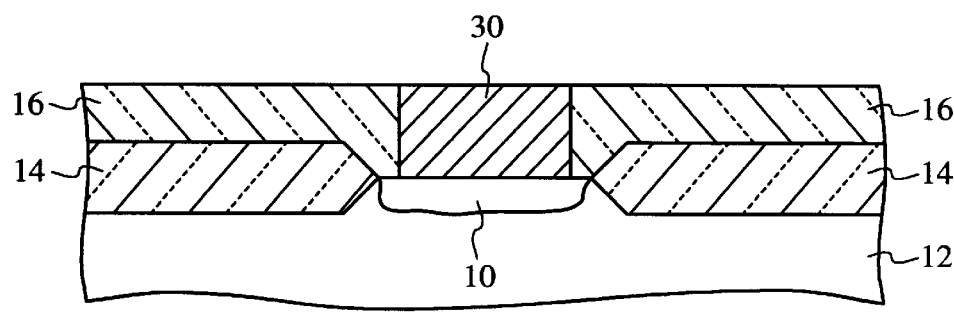

At this stage of processing, the second layer of photoresist 26 may be removed and the opening 28 filled with material such as metal to form an interconnect 30 as shown in FIG. 8. Examples of metals suitably employed in the practice of the present invention include tungsten and aluminum. Titanium and titanium-tungsten may also be employed to form the interconnect 30. However, the metalization employed for the interconnect 30 is conventional and forms no part of this invention.

It will be appreciated that the method of the present invention is not limited to etching an opening 28 in a layer of oxide 16. The method of the present invention will find use in patterning features in materials other than oxide, and consequently, the layer of oxide 16 is herein referred to broadly as a layer of material. Other dielectrics as well as other materials such as metal and semiconductor may be patterned as well.

In an alternative embodiment, a second layer of photoresist 26 is not employed to cover the step 24. Rather, a layer of planarizable material 26 other than photoresist, such as described below, is employed.

The process flow is identical to the steps described above all the way through etching the step 24 in the layer of oxide 16 and removing the patterned segment of photoresist 18. FIG. 4 shows the step 24 in the layer of oxide 16 at this stage in the processing. In this alternative embodiment, a layer of planarizable material 26 is formed on the layer of oxide 16. As with the second layer of photoresist 26, the thickness of the layer of planarizable material 26 is preferably sufficient to cover the step 24 as depicted in FIG. 5.

The layer of planarizable material 26 is planarized by etchback or polishing, such that the step 24 in the layer of oxide 16 is exposed as shown in FIG. 6.

Preferably, the layer of planarizable material 26 is planarized by polishing. Spin-on photoresist, for example, which is not polished, will be flat only over local regions upon drying. Additionally, spin-on photoresist will not flatten if formed over holes and/or features which are too large. In contrast, polishing enables the layer of planarizable material 26 to be uniformly smooth over larger holes and/or features as well as over wider regions. Accordingly, polishing enables the layer of planarizable material 26 to be uniformly smooth over the step 24. It will be appreciated that polishing may comprise chemical mechanical polishing.

As described above, the exposed oxide is etched thereby forming an opening 28 in the layer of oxide 16 as depicted in FIG. 7. The layer of planarizable material 26 serves as a mask during the etching of the layer of oxide 16. Consequently, the etching process must selectively etch the layer of oxide 16 and not the layer of planarizable material 26. Accordingly, any material that is both planarizable by either etchback or polishing and that is resistant to the etchant employed to etch the layer of material 16, may be employed as the layer of planarizable material 26. In this case, the layer of oxide 16 is the layer of material. Accordingly, the layer of planarizing material 26 must be resistant to the etchant used to etch the layer of material 16 (layer of oxide). Consequently, the layer of material 16 (layer of oxide) is selectively etched with respect to the layer of planarizable material 26.

Alternatively, the layer of planarizable material 26 may comprise oxide, which can be polished, and the layer of material 16 may comprise a nitride, for example, BN (boron nitride). Boron nitride can be selectively etched with respect to oxide. Other suitably employed planarizable materials may be used in the method of the present invention. An example of another planarizable material suitably employed in the method of the present invention includes polysilicon. Polysilicon can be also used as the layer of planarizable material 26 when the layer of material 16 comprises oxide. Polysilicon is also planarized by polishing.

In addition, polyimides may be may be used as the layer of planarizable material 26 when the layer of material 16 comprises oxide. Polyimides are flat upon deposition and can be etched back to expose the step 24. Conversely, oxide may also be used as the layer of planarizable material 26 and the layer of material 16 may comprises a polyimide. As described above, oxide is planarized with polishing.

At this stage of processing, the layer of planarizable material 24 may be removed and the opening 28 filled with material such as metal to form an interconnect 30 as shown in FIG. 8. As described above, examples of metals suitably employed in the practice of the present invention include tungsten and aluminum. Titanium and titanium-tungsten may also be employed to form the interconnect 30. The metalization employed for the interconnect 30 is conventional and forms no part of this invention.

As described above, it will be appreciated that the method of the present invention is not limited to etching an opening 28 in a layer of dielectric 16, and in particular, to a layer of oxide 16. Other dielectrics, as well as other materials such as metal and semiconductor, may be patterned as well. In any case, however, the layer of planarizable material 26 which may be a second layer of photoresist 26, must be resistant to the etchant employed to etch the layer of material 16.

The method of the present invention will find immediate applicability in defining small structures such as contact/via openings and metal lines. The method of the present invention may be applied to future 0.25 µm technology.

INDUSTRIAL APPLICABILITY

The method of the invention for forming small structures ≦0.5 µm in size such as contacts, vias, and metal lines is expected to find use in the fabrication of all deep sub-micrometer IC technology.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Many variations of films and materials are possible. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A method for using a clear field reticle to form a photoresist mask comprising patterned segments defining openings formed in a layer of dielectric material created over a semiconductor substrate, said method comprising the steps of:

(a) forming a first layer of photoresist on said layer of dielectric material formed over said semiconductor substrate;

(b) exposing said first layer of photoresist to a light, said light being transmitted towards said first layer of photoresist through a clear field reticle, said clear field reticle having a pattern of clear areas and of dark areas, said clear areas allowing said light to pass through and strike portions of said first layer of photoresist under said clear areas, said portions become exposed regions, said dark areas preventing said light from passing through to other portions of said first layer of photoresist under said dark areas, said other portions remain unexposed regions, said pattern including a reverse image of said openings wherein said dark areas and said unexposed regions under said dark areas represent said openings and have a size, a shape, and a location which define a size, a shape, and a location of said openings, and wherein said clear areas and said exposed regions under said clear areas represent spaces between said openings;

(c) developing said first layer of photoresist, thereby removing said exposed regions of said first layer of photoresist, said unexposed regions remaining intact thereby forming said patterned segments of said photoresist mask, said patterned segments replicating said pattern of dark areas;

(d) etching said layer of dielectric material forming a plurality of steps therein, a step formed beneath each of said patterned segments of photoresist, said step being one of said plurality of steps, said plurality of steps delineating said size, said shape, and said location of said openings intended to be formed in said layer of dielectric material;

(e) removing said first layer of photoresist;

(f) depositing a layer of planarizable material over said layer of dielectric material;

(g) removing a portion of said layer of planarizable material, thereby exposing said plurality of steps in said layer of dielectric material; and (h) etching said layer of dielectric material, thereby forming said openings therein, said layer of planarizable material serving as a mask during etching.

2. The method of claim 1 wherein removing a portion of said layer of planarizable material is accomplished by etchback or polishing.

3. The method of claim 2 wherein removing a portion of said layer of planarizable material causes said layer of planarizable material to become planarized.

4. The method of claim 1 wherein said layer of planarizable material is removed after etching said layer of material to form said openings therein.

5. The method of claim 1 wherein said layer of dielectric material is selected from the group of materials consisting of oxide, nitride, and polyimide.

6. The method of claim 5 wherein said layer of planarizable material is selected from the group of materials consisting of photoresist, polysilicon, polyimide, and oxide.

7. The method of claim 6 wherein said layer of dielectric material comprises oxide and said layer of planarizable material comprises polysilicon, and removing a portion of said planarizable material is accomplished by etchback.

8. The method of claim 6 wherein said layer of dielectric material comprises oxide and said layer of planarizable material comprises polyimide, and removing a portion of said planarizable material is accomplished by etchback.

9. The method of claim 6 wherein said layer of dielectric material comprises boron nitride and said layer of planarizable material comprises oxide, and removing a portion of said planarizable material is accomplished by polishing.

10. The method of claim 6 wherein said layer of dielectric material comprises polyimide and said layer of planarizable material comprises oxide, and removing a portion of said planarizable material is accomplished by polishing.

11. The method of claim 1 wherein at least one of said openings is filled with a metal.

12. The method of claim 1 wherein said layer of planarizable material is deposited on said layer of dielectric material in step (f) such that said layer of planarizable material covers each said step in said layer of dielectric material.

13. A method for using a clear field reticle to form a photoresist mask comprising patterned segments defining openings formed in a layer of dielectric material created over a semiconductor substrate, said method comprising the steps of:

(a) forming a first layer of photoresist on said layer of dielectric material formed over said semiconductor substrate;

(b) exposing said first layer of photoresist to a light, said light being transmitted towards said first layer of photoresist through a clear field reticle, said clear field reticle having a pattern of clear areas and of dark areas, said clear areas allowing said light to pass through and strike portions of said first layer of photoresist under said clear areas, said portions become exposed regions, said dark areas preventing said light from passing through to other portions of said first layer of photoresist under said dark areas, said other portions remain unexposed regions, said pattern including a reverse image of said openings wherein said dark areas and said unexposed regions under said dark areas represent said openings and have a size, a shape, and a location which define a size, a shape, and a location of said openings, and wherein said clear areas and said exposed regions under said clear areas represent spaces between said openings;

(c) developing said first layer of photoresist, thereby removing said exposed regions of said first layer of photoresist, said unexposed regions remaining intact thereby forming said patterned segments of said photoresist mask, said patterned segments replicating said pattern of dark areas;

(d) etching said layer of dielectric material forming a plurality of steps therein, a step formed beneath each of said patterned segments of photoresist, said step being one of said plurality of steps, said plurality of steps delineating said size, said shape, and said location of said openings intended to be formed in said layer of dielectric material;

(e) removing said first layer of photoresist;

(f) depositing a second layer of photoresist over said layer of dielectric material;

(g) removing a portion of said second layer of photoresist, thereby exposing said plurality of steps in said layer of dielectric material; and (h) etching said layer of dielectric material, thereby forming said openings therein, said second layer of photoresist serving as a mask during etching.

14. The method of claim 13 wherein removing a portion of said second layer of photoresist is accomplished by etchback.

15. The method of claim 13 wherein said second layer of photoresist is removed after etching said layer of dielectric material to form said openings therein.

16. The method of claim 13 wherein said at least one of said openings is filled with a metal.

17. The method of claim 16 wherein said layer of dielectric material comprises oxide.

18. The method of claim 13 wherein said second layer of photoresist is deposited on said layer of dielectric material in step (f) such that said second layer of photoresist covers each said step in said layer of material.

* * * * *